(12) United States Patent
Maeurer et al.

(10) Patent No.: US 8,446,021 B2
(45) Date of Patent: May 21, 2013

(54) MICROFLUIDIC COMPONENT AND METHOD FOR MANUFACTURING SAME

(75) Inventors: Christian Maeurer, Aachen (DE); Johanna May, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 558 days.

(21) Appl. No.: 12/679,636

(22) PCT Filed: Jul. 28, 2008

(86) PCT No.: PCT/EP2008/059847
§ 371 (c)(1),
(2), (4) Date: Mar. 23, 2010

(87) PCT Pub. No.: WO2009/043614
PCT Pub. Date: Apr. 9, 2009

(65) Prior Publication Data
US 2010/0201005 A1   Aug. 12, 2010

(30) Foreign Application Priority Data
Sep. 27, 2007   (DE) .......................... 10 2007 046 305

(51) Int. Cl.
*H01L 23/31*   (2006.01)
(52) U.S. Cl.
USPC .................... 257/790; 257/E21.502; 438/761
(58) Field of Classification Search
USPC ... 257/790, E21.502, E23.123, 253; 438/761; 422/82.05; 204/406
See application file for complete search history.

(56) References Cited

U.S. PATENT DOCUMENTS

| | | | | |
|---|---|---|---|---|
| 5,882,465 | A * | 3/1999 | McReynolds | 156/285 |
| 6,547,942 | B1* | 4/2003 | Parce et al. | 204/453 |
| 6,787,088 | B2* | 9/2004 | Parce et al. | 264/241 |
| 7,497,994 | B2* | 3/2009 | Gandhi et al. | 422/504 |
| 2003/0026740 | A1* | 2/2003 | Staats | 422/102 |
| 2007/0007240 | A1 | 1/2007 | Wise et al. | |
| 2009/0013768 | A1* | 1/2009 | Pouteau et al. | 73/61.48 |

FOREIGN PATENT DOCUMENTS

| | | |
|---|---|---|
| DE | 601 05 979 | 10/2005 |
| WO | 9721090 | 6/1997 |
| WO | 9919717 | 4/1999 |
| WO | 2007/054710 | 5/2007 |
| WO | 2007/079530 | 7/2007 |

OTHER PUBLICATIONS

Lee Hartley et al : "Hybrid Integration of an Active Pixel Sensor and Microfluidics for Cytometry on a Chip": IEEE Transactions on Citruits and Systems Part 1 : Regular Papers, IEEE Service Center, New York, NY, US, Bd. 54, Nr.1, Jan. 1, 2007, pp. 99-110, XP01 1155720.

* cited by examiner

*Primary Examiner* — Roy Potter
(74) *Attorney, Agent, or Firm* — Kenyon & Kenyon LLP

(57) ABSTRACT

A microfluidic component having at least one first polymer layer, which is provided with a microstructure for at least one fluid, and having at least one second polymer layer. It is provided that at least one semiconductor component is situated on the first and/or the second polymer layer. Furthermore, a manufacturing method for such a microfluidic component is described.

18 Claims, 5 Drawing Sheets

MICROFLUIDIC COMPONENT AND METHOD FOR MANUFACTURING SAME

FIELD OF THE INVENTION

The present invention relates to a microfluidic component and a method for manufacturing microfluidic components of this type.

BACKGROUND INFORMATION

A microfluidic component which is formed by multiple polymer layers is discussed in German patent document DE 601 05 979 T2. The polymer layers have a microstructure which forms a microchannel or a reservoir for a fluid. The microstructure is introduced into the polymer layers by using an erosive method.

In addition to the microfluidic components from DE 601 05 979 T2, other microfluidic components, designed as a micropump or a pressure sensor, including multiple polymer layers having a microstructure for receiving, storing, or conducting a fluid, are known.

Moreover, it is understood that semiconductor elements may be integrated into a polymer. The semiconductor element is sealed or extrusion-coated using plastic for protecting it against corrosion and undesirable environmental influences. A polymer-semiconductor package manufactured in this way is extremely sturdy and easily integrated into complex devices. In addition to the protective function for the semiconductor component and the facilitated handling of the package, the polymer has no other functions. The disadvantage in the known packages is that they previously had to be processed individually and are not manufacturable in batches.

SUMMARY OF THE INVENTION

An object of the exemplary embodiments and/or exemplary methods of the present invention is to extend the functionality of a microfluidic component. An additional object is to provide a suitable manufacturing method for such a multifunctional microfluidic component.

This object is achieved with regard to the microfluidic component by the features described herein and with regard to the manufacturing method by the features described herein. Advantageous refinements of the exemplary embodiments and/or exemplary methods of the present invention are further described herein. All combinations of at least two features disclosed in the description, the claims and/or the figures fall within the scope of the present invention. To avoid repetitions, features disclosed as purely device-related should count as being disclosed as method-related and claimable. Likewise, features disclosed as purely method-related should count as being disclosed as device-related and claimable.

The exemplary embodiments and/or exemplary methods of the present invention is based on the idea of extending the function of the microfluidic component, which includes at least two, which may be flat, polymer layers of which at least one is provided with a microstructure for a fluid, in such a way that a semiconductor component is integrated into the microfluidic component, in particular by attaching the semiconductor component to a polymer layer or to an element attached to the polymer layer. In other words, a package is proposed including at least one semiconductor component and two polymer layers in which at least one of the polymer layers has not only the task of protecting the semiconductor component but additionally has the function as a microfluidic (function) element. The semiconductor component may be a semiconductor component which cooperates with the microstructure for the fluid, for example a control chip for a micropump formed in the polymer layers, an analyzer unit for a microfluidic sensor, a semiconductor micropump, or a semiconductor sensor. The semiconductor component may be a microchip. However, it is also conceivable to place or attach other active or passive semiconductor components on at least one of the polymer layers. Due to the integration of at least one semiconductor component into a microfluidic component, "intelligent" microfluidic components may be manufactured for the first time which, in addition to purely microfluidic functions such as storing, receiving and/or pumping fluids, which may be liquids, take on the additional functionality of a semiconductor component which may cooperate with the microfluidic structure. In terms of the exemplary embodiments and/or exemplary methods of the present invention, a microstructure is understood to be a surface structure and/or a structure penetrating at least one polymer layer which is used for receiving, storing and conveying fluids. For example, the microstructure may be a fluidic channel and/or a fluid reservoir, and/or a fluid cavern, etc. The microstructure may be an integral part of a micromixer, a micropump or a microsensor, in particular due to the cooperation of at least two polymer layers.

The at least two polymer layers of the microfluidic component, designed according to the concept of the exemplary embodiments and/or exemplary methods of the present invention, are joined together. The at least one semiconductor component may be situated on the first polymer layer, but may also be situated on the at least second polymer layer. It is conceivable here that between the at least one microstructured first polymer layer and the second polymer layer having the semiconductor component, an additional structured or non-structured polymer layer is provided.

A microfluidic component, designed according to the concept of the present invention, or a package having a semiconductor component and a microfluidic function, does not have to be processed individually, but rather a plurality of microfluidic components or packages may be manufactured simultaneously using a batch and/or reel-to-reel process. The microfluidic components obtained in this way may be multiple-use components as well as disposable components. Suitable polymers for forming the polymer layers are, for example, thermoplastics, e.g., polycarbonate (PC), COC, PMMA; thermosets, e.g., epoxy resins, as well as UV polymerizates.

In terms of manufacturing, in particular with regard to fast and effective manufacturing in a batch and/or reel-to-reel process, it is advantageous when the at least one microstructure is produced by using a forming method. The microstructure may be produced with the aid of hot embossing technology or thermoforming and/or with the aid of UV imprinting. Due to the use of forming technology for forming the microstructures, different polymer shapes may be reproduced in the same manufacturing process so that it is possible to closely adapt the microfluidic component or the package to be manufactured to customer requirements even for small quantities.

One specific embodiment is particularly advantageous in which the semiconductor component is not situated on the outside of the microfluidic component but rather in which the semiconductor component is accommodated between at least two polymer layers of the microfluidic component. In particular for the case in which the two (flat) polymer layers tightly enclose the semiconductor component, i.e., hermetically encapsulating it from the surroundings, optimal protection of the semiconductor component against corrosion or other undesirable environmental impacts is achieved.

In order to make electrical contacting of the semiconductor component possible, one specific embodiment is advantageous in which at least one electrical contact for the semiconductor component is provided on the microfluidic component, which may be on the outside of the microfluidic component. This contact may be a plug-in contact which is electrically connectable in a simple manner. It is conceivable to fix the contact on the component by gluing, for example, or by forming it, at least partially, by using an appropriate structuring method on at least one polymer layer.

Particularly advantageous is one specific embodiment in which at least one metal plating is provided on at least one polymer layer, which may be on the polymer layer having the semiconductor component. The metal plating may form a printed conductor for connecting the semiconductor component to an electrical contact of the microfluidic component. In addition, the metal plating may have the function of an electrode structure, etc. The metal plating may be applied to or integrated into the polymer layer in a simple manner by using suitable methods such as sputtering, hot embossing, chemically, or galvanically. Additional printed conductors made of plastic or ceramic may advantageously be dispensed with.

Additionally or alternatively to providing at least one metal plating for contacting the at least one semiconductor component, at least one flex-cable may be provided particularly in the event when pure contacting of the semiconductor component, which may be the microchip, is to be implemented. The at least one cable may have a contact surface (footprint) for contacting or fixing the semiconductor component. The semiconductor is connected to the contact surface with the aid of wire bonds or by using a flip-chip method. It is possible to contact the flex-cable from the outside by providing a plug-in contact.

In a refinement of the exemplary embodiments and/or exemplary methods of the present invention, at least one fluid connector is provided on the microfluidic component for a fluidic connection of the microfluidic component or the package. The fluid connector may be designed as a Luer lock, an olive or a hose nipple, for example. It is conceivable to glue the at least one fluid connector from the outside or, at least partially, to form it from at least one polymer layer by appropriate structuring.

The functionality of the microfluidic component or the package may be enhanced even further when polymer actuators and/or polymer sensors or also polymer electronics are integrated into the microfluidic component.

The functionality may be further enhanced by integrating at least one optical element into the microfluidic component. The optical element is integrated or manufactured by suitably structuring or metal plating at least one polymer layer. For example, (Fresnel) lenses, optical windows, fiber optics, or, if suitably metal plated, mirrors may be used as optical elements.

In a refinement of the exemplary embodiments and/or exemplary methods of the present invention, at least one optical connector is to be provided for appropriately contacting the at least one optical element in the microfluidic component. This may be a fiber optic connector, for example.

One specific embodiment is particularly advantageous in which the microfluidic component is not processed individually, but rather in which the component is manufactured using a batch method and/or a reel-to-reel method.

The exemplary embodiments and/or exemplary methods of the present invention also relates to a method for manufacturing a previously described microfluidic component. The core of the manufacturing method is that rather than one element being processed individually, a plurality of microfluidic components or packages is manufactured simultaneously using a batch method and/or a reel-to-reel method. Since overall only a few elements must be joined (structured polymer layers, possibly unstructured polymer layers, semiconductor components), the construction and manufacturing of a microfluidic component, designed according to the concept of the present invention, is surprisingly simple.

Further advantages, features, and details of the present invention arise from the following description of exemplary embodiments as well as from the drawings.

DETAILED DESCRIPTION

Figure 1:
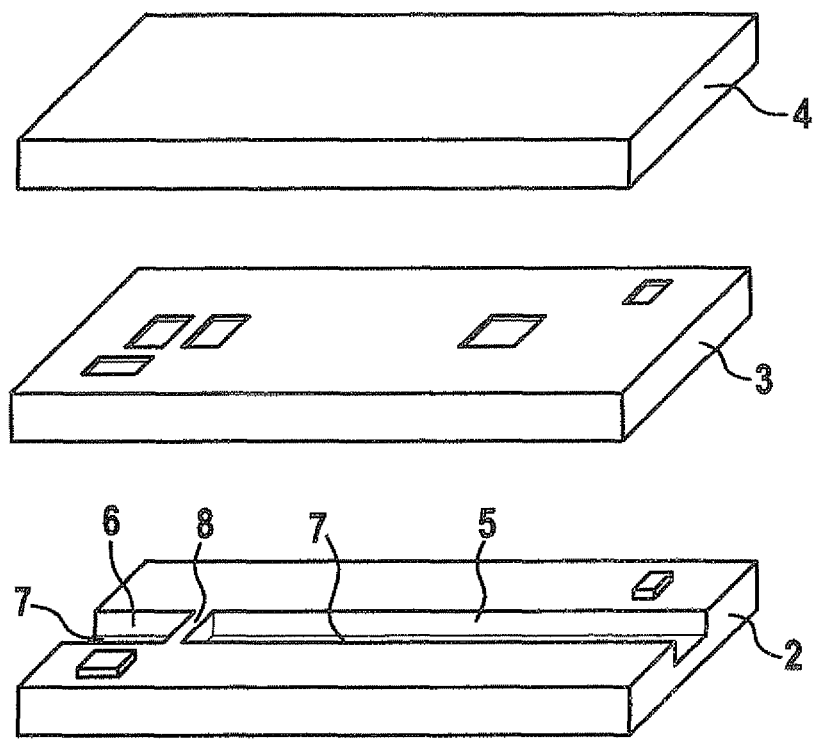
FIG. 1 shows a first method step for manufacturing a microfluidic component in which the polymer layers are suitably structured.

In the figures, the same reference numerals indicate the same components and components having the same function.

Figure 6:
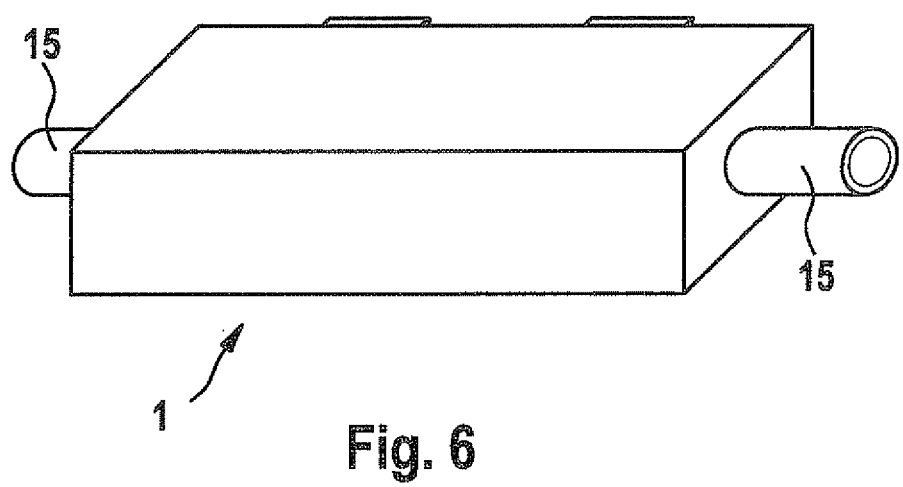
FIG. 6 shows a sixth method step for manufacturing a microfluidic component in which fluidic connectors are attached to the microfluidic component.

FIG. 1 shows a first manufacturing step for producing a microfluidic component 1 (package) as shown in FIG. 6. Apparent are a first polymer layer 2, a second polymer layer 3 situated in the drawing plane on top of the first polymer layer, and a third polymer layer 4, used as a cover, situated in the drawing plane on top of the second polymer layer.

In the first method step, first polymer layer 2 is provided with a microstructure 5, 6 for a fluid. The shown microstructures 5, 6 are only selected as an example. Microstructures 5, 6 in first polymer layer 2 are a microfluid channel 7 interrupted by a transverse wall 8. Microstructures 5, 6 are integral parts of a fluid valve for a micropump which will be explained later. Microstructures 5, 6 are introduced into first polymer layer 2 using a forming method. Further structures in the form of through-holes, alignment pins, adhesive trenches, etc., may be provided in addition to the shown microstructures 5, 6. As an alternative to the introduction of microstructures 5, 6 with the aid of a forming method, producing the structured polymer layers 2, 3, 4 as injection molded parts is conceivable.

Figure 2:
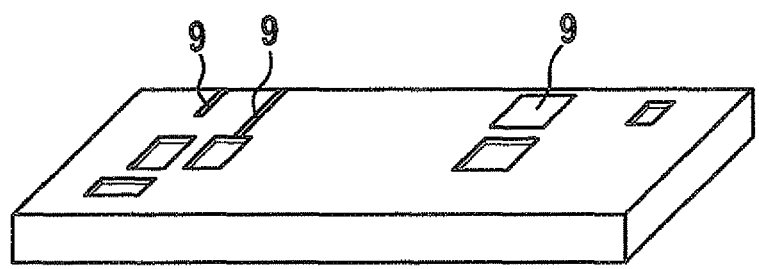
FIG. 2 shows a second method step for manufacturing a microfluidic component in which one polymer layer is metal plated.

FIG. 2 shows a second method step for manufacturing the microfluidic component 1 (package) as shown in FIG. 6. Metal platings 9, used as printed conductors, are applied to the structured second polymer layer 3. In addition to sputtering, vapor deposition, or the galvanic or electroless application, applying the metal plating using a printing method, in particular a screen printing or digital printing method, is conceivable.

Figure 3:
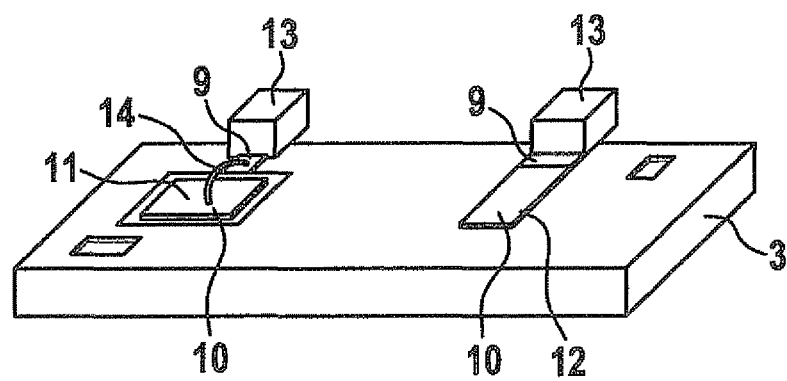
FIG. 3 shows a third method step for manufacturing a microfluidic component in which the semiconductor components are glued on or contacted.

FIG. 3 shows a third method step for manufacturing a microfluidic component 1 (package). In this exemplary embodiment, semiconductor components 10, a micropump chip 11 and a flow sensor 12 are glued and contacted onto second polymer layer 3. In addition, appropriate electrical connectors 13 are glued on in such a way that metal platings 9 are in contact. Micropump 11 is electrically contacted via metal plating 9 and thus via one of connectors 13 using wire bonds 14. Flow sensor 12 is in direct contact with metal plating 9 and is thus, without having to provide wire bonds, connected electrically conductively to connector 13 on the right-hand side in the drawing plane.

Depending on the layout of semiconductor element 10, it is advantageous to apply the adhesive for a flip-chip contact of the semiconductor components, as well as the adhesive for sealing fluidic connectors, which will be explained later, in the same step. In the event that wire bonding is necessary, the respective semiconductor component may first be glued on fluid-tight and only then bonded. As shown, connectors 13 may be glued on using an electrically conductive adhesive or, depending on the properties of the material (which may be plastic), may be soldered or also plugged onto the polymer layer.

Figure 4:
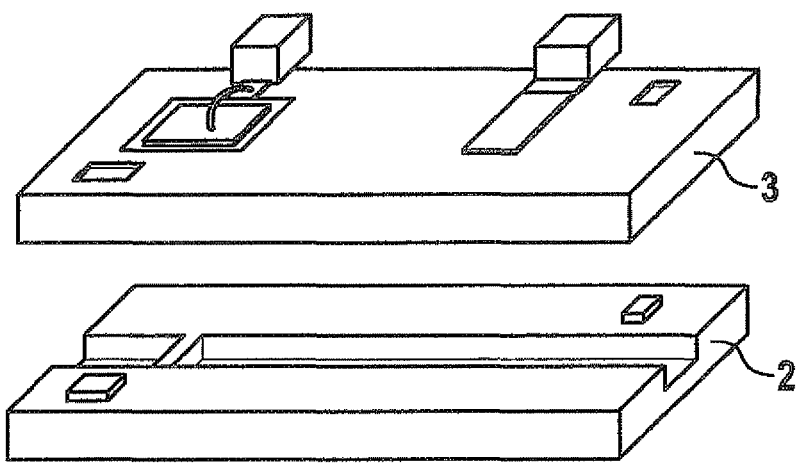
FIG. 4 shows a fourth method step for manufacturing a microfluidic component in which two polymer layers are joined.

In a fourth method step shown in FIG. 4, second polymer layer 3 and first polymer layer 2 are joined. Different joining methods may be implemented here. For example, polymer layer 2, 3 is joined via thermo-compression bonding, resistance joining, laser transmission welding, ultrasonic welding, etc. During the joining process it must be ensured that microchannel 7 in first polymer layer 2 is properly sealed. If needed, the second method step and the third method step (FIG. 2 and FIG. 4) may be interchanged.

Figure 5:
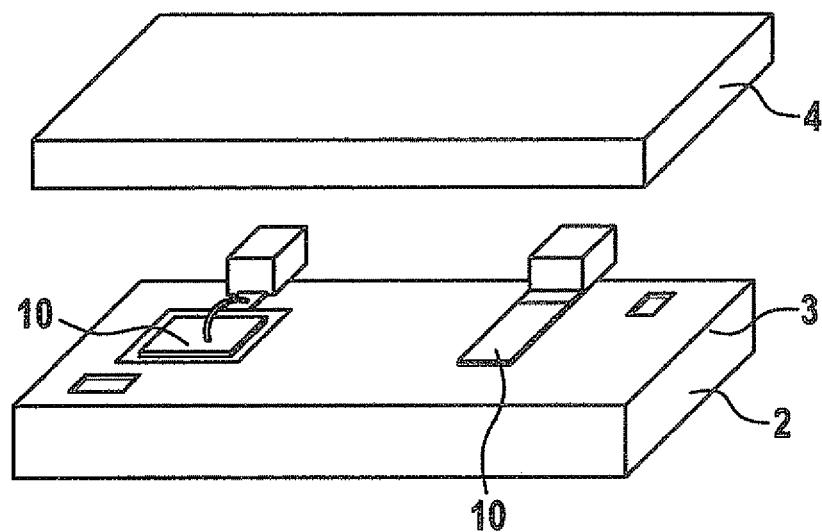
FIG. 5 shows a fifth method step for manufacturing a microfluidic component in which the semiconductor components are covered (encapsulated) using the third polymer layer.

In a fifth method step shown in FIG. 5, semiconductor components 10 are encapsulated with the aid of the third, non-structured polymer layer 4. For this purpose, third polymer layer 4 as a cover is joined to second polymer layer 3—which may be done using an above-named joining method.

Finally, in a sixth method step shown in FIG. 6, fluidic connectors 15 are attached from the outside to be able to supply microstructures 5, 6, i.e., microchannel 7, with a fluid.

Figure 7:
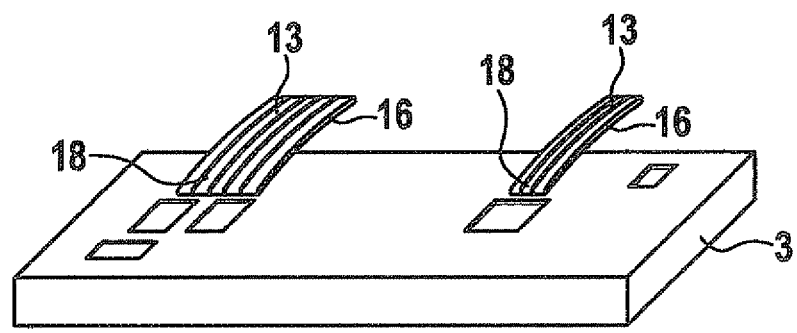
FIG. 7 shows an alternative method step to the second method step in which a flexible conductor cable (flex-cable) having a suitable contact surface is provided instead of metal platings.

FIG. 7 shows a method step as an alternative to the method step according to FIG. 2. Instead of metal platings 9, flex-cables 16 (flexible cables) are used and glued to second polymer layer 3. Flex-cables 16 simultaneously form electrical connectors 13, pointing to the outside, for contacting the semiconductor components which are not yet applied in FIG. 7. If needed, flex-cables 16 may be provided with appropriate plug-in connectors, etc., at their ends. Flex-cables 16 are provided with a suitable contact surface 18 for flip-chip contacting of semiconductor components 10.

Figure 8:
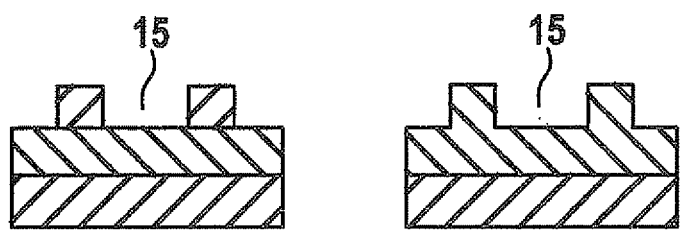
FIG. 8 shows an alternative method step to the sixth method step in which fluidic connectors are not glued on but rather embossed.

FIG. 8 shows a method step as an alternative to the sixth method step shown in FIG. 6. Fluidic connectors 15 are not designed as separate components here, but rather are embossed in a polymer layer.

Figure 9:
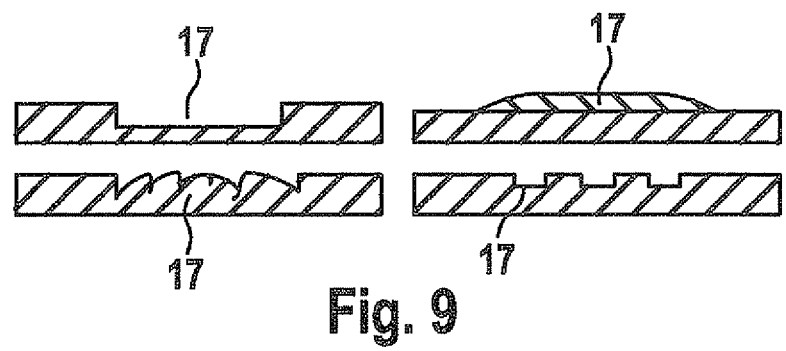
FIG. 9 shows polymer layers having different optical elements which may be integral parts of a microfluidic component.

FIG. 9 shows different optical elements 17, which are each introduced into a polymer layer. These polymer layers may be integral parts of a microfluidic component 1 including at least one polymer layer microstructured for a fluid and at least one semiconductor component. FIG. 9 shows from left to right and from top to bottom as examples: one optical window, a lens, gratings, and several smaller optical windows.

Figure 10:
FIG. 10 shows different composites of two polymer layers of which in each case one polymer layer is structured, the composites being designed as actuators which may be integral parts of a microfluidic component.

Two different polymer actuators 19 which may be integral parts of a microfluidic component 1 (package) are shown in FIG. 10. For example, the polymer actuators may be metal plated diaphragms which allow an electrostatic pump or also a thermopneumatic pump to be actuated, for example.

Figure 11:
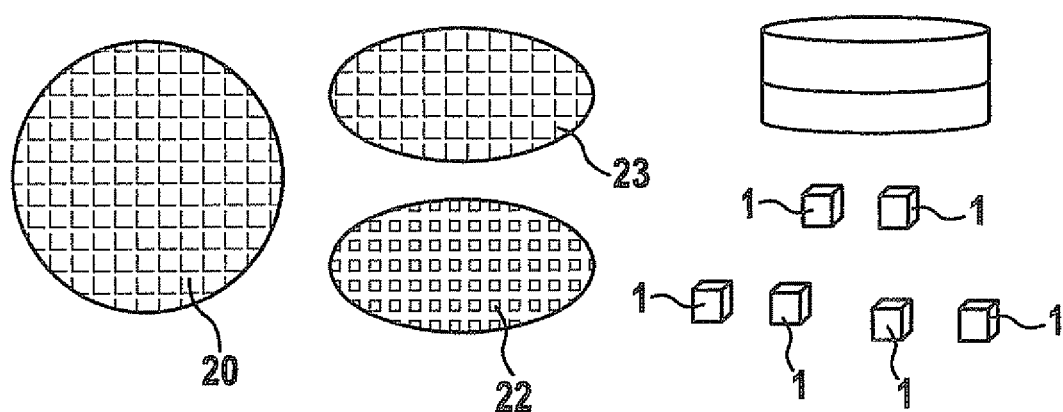
FIG. 11 shows a schematic representation of a batch process for manufacturing the microfluidic component.

FIG. 11 shows as an example a batch method for the simultaneous manufacture of multiple microfluidic components 1. Apparent are multiple polymer substrates 20, 21, 22, which, after a final separation process, form a plurality of first, second, and third polymer layers. Polymer substrates 20, 21, 22 are processed simultaneously, i.e., microstructured, and if needed provided with semiconductor components, subsequently joined to form a composite 23 and finally divided into individual microfluidic components 1 (cut, sawn).

Figure 12:
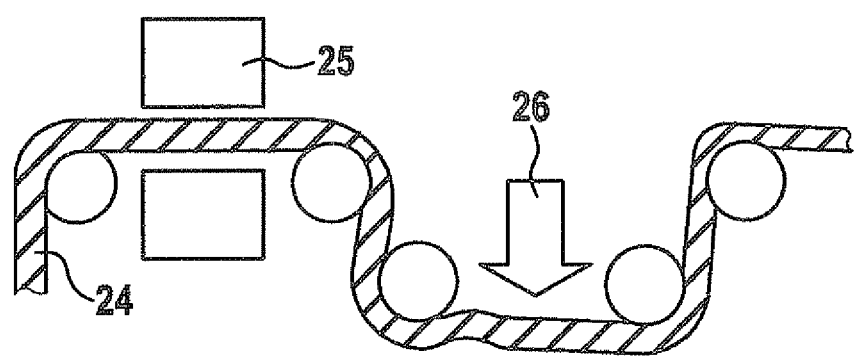
FIG. 12 shows a schematic representation of a reel-to-reel process for manufacturing a microfluidic component.

FIG. 12 shows as an example a reel-to-reel process for the simultaneous manufacture of a plurality of microfluidic components. Polymer foil 24 (plastic foil) is initially structured with the aid of suitable tools 25, metal plated in a metal plating station 26, later provided with suitable semiconductor components, and thereupon laminated together with another polymer foil.

What is claimed is:

1. A microfluidic component, comprising:
   at least one first polymer layer, which is provided with a microstructure for at least one fluid; and
   at least one second polymer layer situated above the at least one first polymer layer,
   wherein at least one semiconductor component is situated on at least one of the first polymer layer and the second polymer layer, and
   wherein at least one flex-cable is provided for contacting the semiconductor component.

2. The component of claim 1, wherein the microstructure is produced using a forming process by at least one of hot embossing and UV imprinting.

3. The component of claim 1, wherein the semiconductor component is accommodated, by being hermetically encapsulated, at least one of (ii) between the first polymer layer and the second polymer layer, and (ii) between the second polymer layer and at least one third polymer layer.

4. The component of claim 1, wherein at least one metal plating, for forming at least one of a printed conductor and an electrode structure, is provided on at least one of the polymer layers, on the polymer layer having the at least one semiconductor component.

5. The component of claim 1, wherein the component has at least one fluid connector for hydraulically contacting the microstructure.

6. A microfluidic component, comprising:
   at least one first polymer layer, which is provided with a microstructure for at least one fluid; and
   at least one second polymer layer situated above the at least one first polymer layer,
   wherein at least one semiconductor component is situated on at least one of the first polymer layer and the second polymer layer, and wherein at least one of (i) at least one polymer actuator, (ii) at least one polymer sensor, and (iii) at least one polymer electronic circuit is integrated into the component.

7. The component of claim 1, wherein an optical element is provided on at least one of the polymer layers.

8. The component of claim 7, wherein at least one optical connector is provided for optically contacting the optical element.

9. The component of claim 1, wherein the component is manufactured using at least one of a batch process and a reel-to-reel process.

10. A method for manufacturing microfluidic components, the method comprising:
   manufacturing simultaneously, using at least one of a batch process and a reel-to-reel process, microfluidic components;
   wherein each of the microfluidic components has at least one first polymer layer, which is provided with a microstructure for at least one fluid, and at least one second polymer layer situated above the at least one first polymer layer, and
   wherein at least one semiconductor component is situated on at least one of the first polymer layer and the second polymer layer, and
   wherein at least one flex-cable is provided for contacting the semiconductor component.

11. The component of claim 6, wherein the microstructure is produced using a forming process by at least one of hot embossing and UV imprinting.

12. The component of claim 6, wherein the semiconductor component is accommodated, by being hermetically encapsulated, at least one of (ii) between the first polymer layer and the second polymer layer, and (ii) between the second polymer layer and at least one third polymer layer.

13. The component of claim 12, wherein at least one connector for electrically contacting the semiconductor component is provided on the component.

14. The component of claim 6, wherein at least one metal plating, for forming at least one of a 28 conductor and an electrode structure, is provided on at least one of the polymer layers, on the polymer layer having the at least one semiconductor component.

15. The component of claim 6, wherein the component has at least one fluid connector for hydraulically contacting the microstructure.

16. The component of claim 6, wherein an optical element is provided on at least one of the polymer layers.

17. The component of claim 16, wherein at least one optical connector is provided for optically contacting the optical element.

18. The component of claim 6, wherein the component is manufactured using at least one of a batch process and a reel-to-reel process.

* * * * *

UNITED STATES PATENT AND TRADEMARK OFFICE
CERTIFICATE OF CORRECTION

PATENT NO.       : 8,446,021 B2
APPLICATION NO.  : 12/679636
DATED            : May 21, 2013
INVENTOR(S)      : Maeurer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 560 days.

Signed and Sealed this
Eighth Day of September, 2015

Michelle K. Lee
*Director of the United States Patent and Trademark Office*